(12) United States Patent
Bolognia et al.

(10) Patent No.: US 11,604,084 B2
(45) Date of Patent: Mar. 14, 2023

(54) SENSOR PACKAGE

(71) Applicant: Analog Devices, Inc., Norwood, MA (US)

(72) Inventors: David Frank Bolognia, Charlestown, MA (US); Jiawen Bai, Brighton, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 17/231,995

(22) Filed: Apr. 15, 2021

(65) Prior Publication Data

US 2022/0333958 A1    Oct. 20, 2022

(51) Int. Cl.
*G01D 11/24* (2006.01)
*B81B 7/00* (2006.01)

(52) U.S. Cl.
CPC .......... *G01D 11/245* (2013.01); *B81B 7/0061* (2013.01)

(58) Field of Classification Search
CPC ............................ G01D 11/245; B81B 7/0061
See application file for complete search history.

(56) References Cited

U.S. PATENT DOCUMENTS

| | | |
|---|---|---|
| 2,729,976 A | 1/1956 | Laub |
| 3,894,538 A | 7/1975 | Richter |
| 4,335,835 A | 6/1982 | Beigler et al. |
| 4,587,843 A | 5/1986 | Tokura et al. |
| 4,677,850 A | 7/1987 | Miura et al. |
| 4,688,424 A | 8/1987 | Handtmann et al. |
| 4,829,818 A | 5/1989 | Bohrer |
| 4,912,974 A | 4/1990 | Inada et al. |
| 5,073,094 A | 12/1991 | Dorman et al. |
| 5,081,866 A | 1/1992 | Ochiai et al. |
| 5,222,395 A | 6/1993 | Matubara et al. |
| 5,527,288 A | 6/1996 | Gross et al. |
| 5,792,952 A | 8/1998 | Ritchart |
| 5,831,159 A | 11/1998 | Renger |
| 6,537,437 B1 | 3/2003 | Galambos et al. |
| 6,591,674 B2 | 7/2003 | Gehman et al. |
| 6,607,495 B1 | 8/2003 | Shalak et al. |

(Continued)

FOREIGN PATENT DOCUMENTS

| | | | | |
|---|---|---|---|---|
| DE | 102014202853 A1 * | 8/2015 | ........... | G01D 11/245 |
| DE | 10 2014 112 261 A1 | 3/2016 | | |

(Continued)

OTHER PUBLICATIONS

Seo, Giwan et al., "Rapid detection of COVID-19 causative virus (SARS-CoV-2) in human nasopharyngeal swab specimens using field-effect-transistor-based biosensor," ACS Nano 2020, American Chemical Society, vol. 14, pp. 5135-5142.

*Primary Examiner* — Jamel E Williams
(74) *Attorney, Agent, or Firm* — Knobbe, Martens, Olson & Bear LLP

(57) ABSTRACT

A sensor package is disclosed. The sensor package can include a housing that at least partially defines a flow channel. The sensor package can also include an electrically conductive spacer that is disposed on a surface of the housing in the flow channel. The sensor package can further include a sensor die that is disposed in and exposed to the flow channel. The sensor die electrically attached to the spacer such that the sensor die is elevated relative to the surface of the housing.

20 Claims, 11 Drawing Sheets

(56) References Cited

U.S. PATENT DOCUMENTS

| | | |
|---|---|---|
| 6,699,234 B2 | 3/2004 | Yeh |
| 6,889,559 B2 | 5/2005 | Gimson |
| 7,096,729 B2 | 8/2006 | Repko et al. |
| 8,088,333 B2 | 1/2012 | Ahmad |
| 8,756,990 B2 | 6/2014 | Speldrich |
| 9,132,231 B2 | 9/2015 | Gross et al. |
| 9,492,614 B2 | 11/2016 | Kamen et al. |
| 9,599,496 B2 | 3/2017 | Asano et al. |
| 9,616,171 B2 | 4/2017 | Qin et al. |
| 9,661,408 B2 | 5/2017 | Kierse et al. |
| 10,191,023 B2 | 1/2019 | Bather et al. |
| 2005/0045480 A1 | 3/2005 | Krumme |
| 2011/0060280 A1 | 3/2011 | Caffey et al. |
| 2016/0105737 A1 | 4/2016 | Kierse et al. |
| 2017/0021145 A1 | 1/2017 | Saul et al. |
| 2017/0115149 A1 | 4/2017 | Silpachai et al. |
| 2017/0232189 A1 | 8/2017 | Qin et al. |
| 2018/0058894 A1* | 3/2018 | Pearson ................ G01F 1/6888 |
| 2018/0266984 A1 | 9/2018 | Pratt et al. |
| 2019/0126018 A1 | 5/2019 | Browd et al. |
| 2019/0135614 A1 | 5/2019 | Kierse et al. |
| 2019/0184095 A1 | 6/2019 | Kim et al. |
| 2019/0255254 A1 | 8/2019 | Wilmont et al. |
| 2020/0158791 A1* | 5/2020 | Marauska ................ G01D 5/16 |
| 2021/0196884 A1 | 7/2021 | Kim et al. |
| 2021/0322681 A1 | 10/2021 | Bolgonia et al. |
| 2022/0062535 A1 | 3/2022 | Bolognia et al. |

FOREIGN PATENT DOCUMENTS

| | | |
|---|---|---|
| EP | 3616737 A2 | 3/2020 |
| GB | 1452104 | 10/1976 |
| WO | WO 95/13839 | 5/1995 |
| WO | WO 2020/040519 A1 | 2/2020 |

* cited by examiner

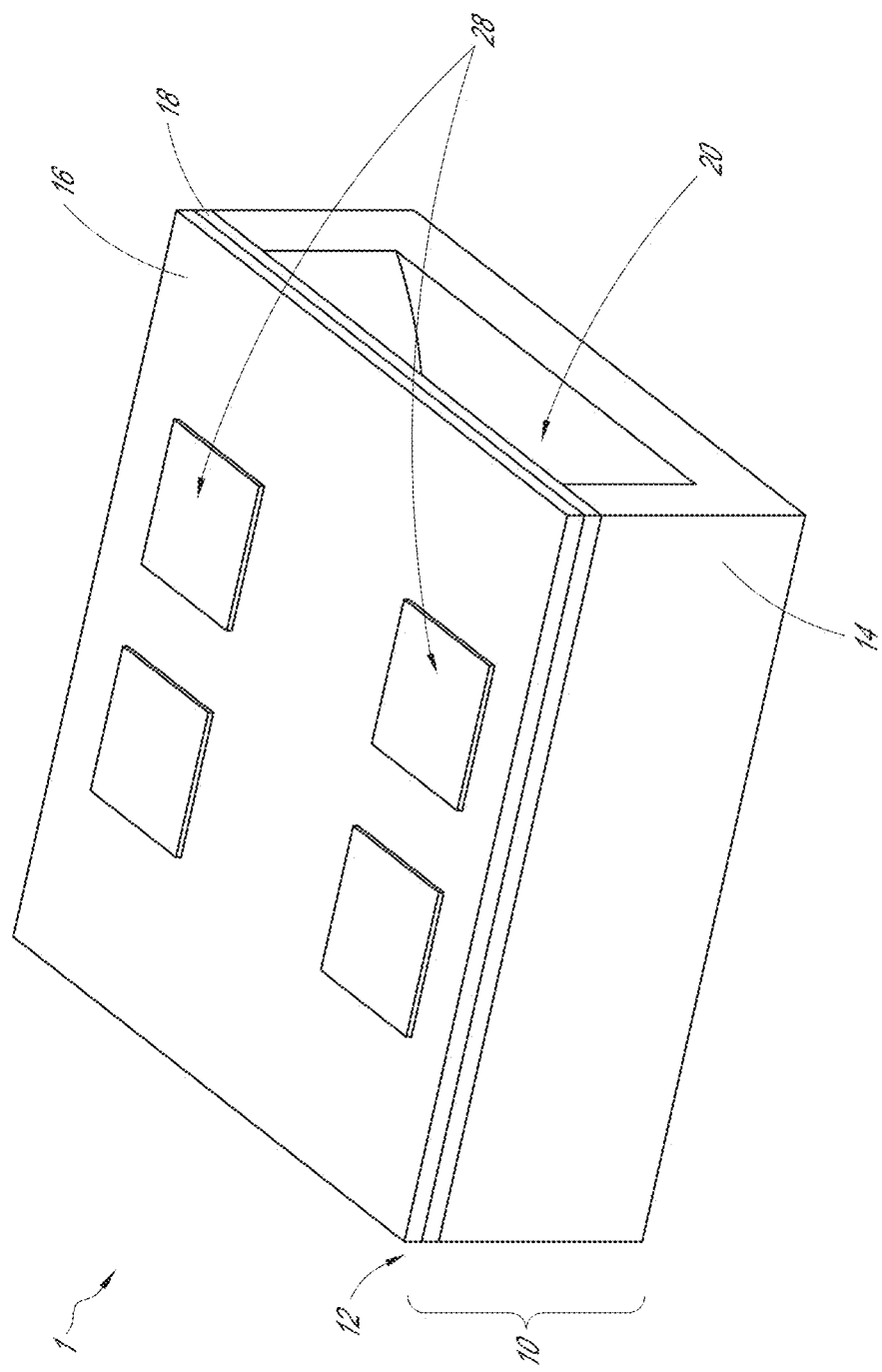

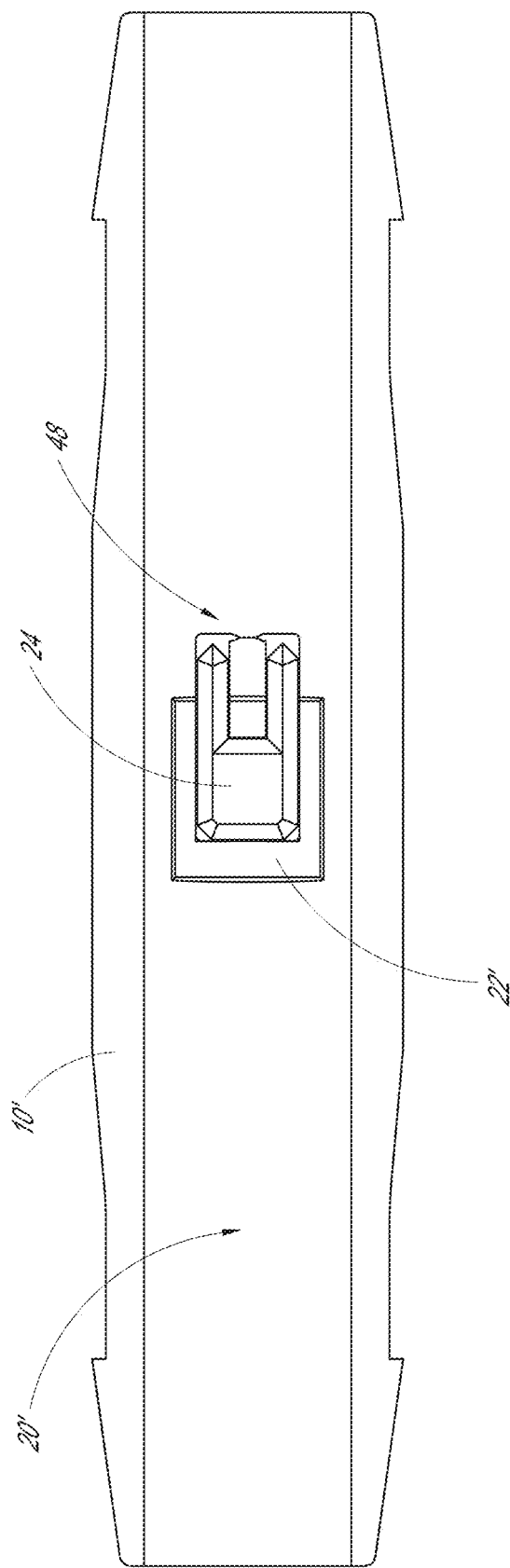

SENSOR PACKAGE

BACKGROUND

Field

The field relates generally to integrated device packages and, in particular, to senor packages.

Description of the Related Art

A sensor die can be packaged in a sensor package. Many types of sensor dies exist. A gas sensor, a pressure sensor, a flow meter, and a bio-sensor are examples of a sensor die. The sensor die can be used to detect characteristics and properties of a target substance. The sensor package can provide a channel for the target substance to flow through, and the sensor die can be provided in the channel to detect the characteristics and/or properties of the target substance.

SUMMARY

In one aspect, a sensor package is disclosed. The sensor package can include a housing that is at least partially defining a flow channel. The sensor package can also include an electrically conductive spacer that is disposed on a surface of the housing and in the flow channel. The sensor package can further include a sensor die that is disposed in and exposed to the flow channel and electrically attached to the spacer such that the sensor die is elevated relative to the surface of the housing.

In one embodiment, the housing includes a substrate and a lid. The sensor die can be electrically coupled with the substrate through the spacer. The housing can further include a mold compound that is disposed at least partially between the substrate and the lid. An electrical component can be embedded in the mold compound. The substrate can include contact pads that are configured to electrically connect the sensor package with an external device or system.

In one embodiment, the spacer includes a metal slug extending transversely from the substrate to connect to the sensor die.

In one embodiment, the spacer includes an embedded lead frame having a conductor at least partially embedded in the spacer.

In one embodiment, the flow channel includes a first portion and a second portion that is spaced apart from the first portion along a length of the flow channel. The first portion can have a channel size different from a channel size of the second portion.

In one embodiment, the sensor die includes a gas sensor die or a biological sensor.

In one embodiment, the sensor die includes a microelectromechanical systems (MEMs)-like sensor with a nanowire sensing element.

In one embodiment, the sensor die includes a sensing element that hangs off of the spacer.

In one embodiment, the sensor die is elevated relative to the surface of the housing such that the sensor die is positioned in a middle of a cross section of the flow channel.

In one embodiment, the sensor die and the spacer are configured to fit in the flow channel having a cross sectional height in a range of 1 mm to 3 mm.

In one aspect, a sensor package is disclosed. The sensor package can include a housing that is at least partially defining a flow channel. The sensor package can also include a spacer that is disposed on a surface of the housing and in the flow channel. The spacer includes an embedded lead frame that has a conductor at least partially embedded in a nonconductive portion of the spacer. The sensor package can further include a sensing element that is disposed in the flow channel. The sensing element is electrically and mechanically attached to the spacer such that the sensing element is elevated relative to the surface of the housing.

In one embodiment, the sensing element includes a nanowire sensing element.

In one embodiment, the sensing element hangs off of the spacer.

In one embodiment, the sensing element is elevated relative to the surface of the housing by a height in a range of 0.5 mm to 1.5 mm.

In one aspect, a sensor package is disclosed. The sensor package can include a housing that is at least partially defining a flow channel and a slot recessed below the flow channel. The flow channel has a narrow region and a wide region that is wider than the narrow region. the sensor package can also include a substrate that has a die mount portion and a connector portion. The die mount portion is disposed in the slot. The sensor package can further include a sensing element that is disposed on the die mount region of the substrate and exposed to the flow channel. The sensing element is electrically coupled with the substrate. The sensing element is positioned such that the sensing element is exposed to the narrow region.

In one embodiment, the sensor package further includes a spacer that is disposed in the narrow region of the channel. The spacer can have a tapered surface.

In one embodiment, the connector portion of the substrate is configured to connect to an external connector. The substrate can be configured to electrically connect the sensing element with the connector.

In one embodiment, a cross sectional size of the narrow region is 20% to 50% of a cross sectional size of the wide region.

BRIEF DESCRIPTION OF THE DRAWINGS

FIG. 1B is a schematic side view of the sensor package illustrated in

FIG. 1A.

FIG. 1C is a schematic bottom perspective view of a sensor package illustrated in FIGS. 1A and 1B.

FIG. 2D is a schematic top plan view of sensor package shown without an upper half portion of a housing to illustrate the internal components.

DETAILED DESCRIPTION

Packages disclosed herein may be used in connection with a sample testing device that can include a sensing device for sensing properties of a chemical. In some embodiments, the sample testing device can be used for detecting a substance, such as bacteria, a virus, for example, influenza, SARS-CoV-2 (the virus which causes COVID-19), a concentration of a chemical or other biological component, etc. The sensing device can be used to detect any suitable type of biological or chemical substance. However, the application of the packages disclosed herein are not limited to such sample testing device. the packages disclosed herein may be used in connection with any sensing applications, such as, gas, pressure, temperature, or flow sensing applications. The packages disclosed herein can detect properties of a biological and/or chemical fluid, including, e.g., liquids and/or gases.

Figure 1A:
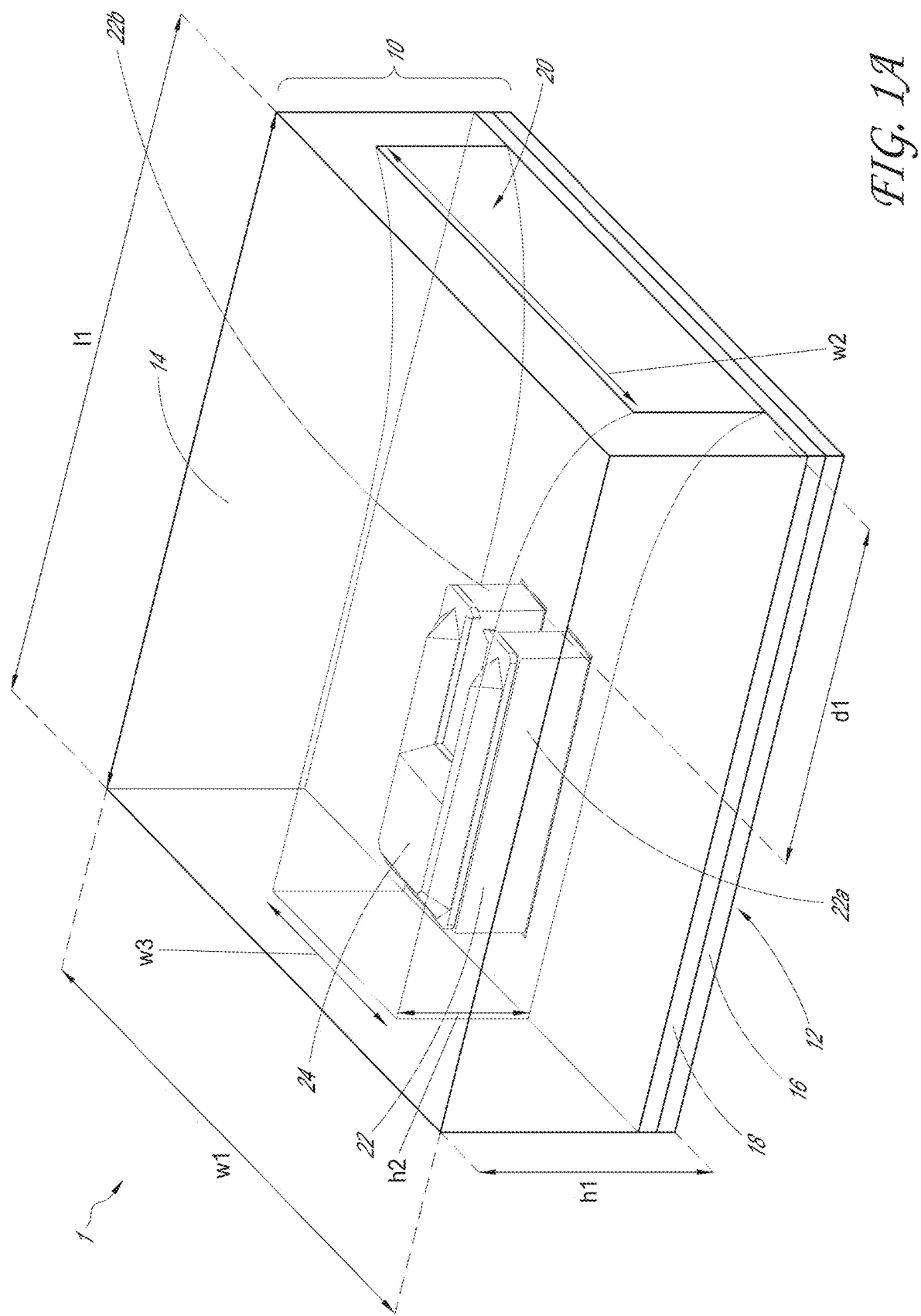
FIG. 1A is a schematic top perspective view of a sensor package according to one embodiment.
Figure 1B:
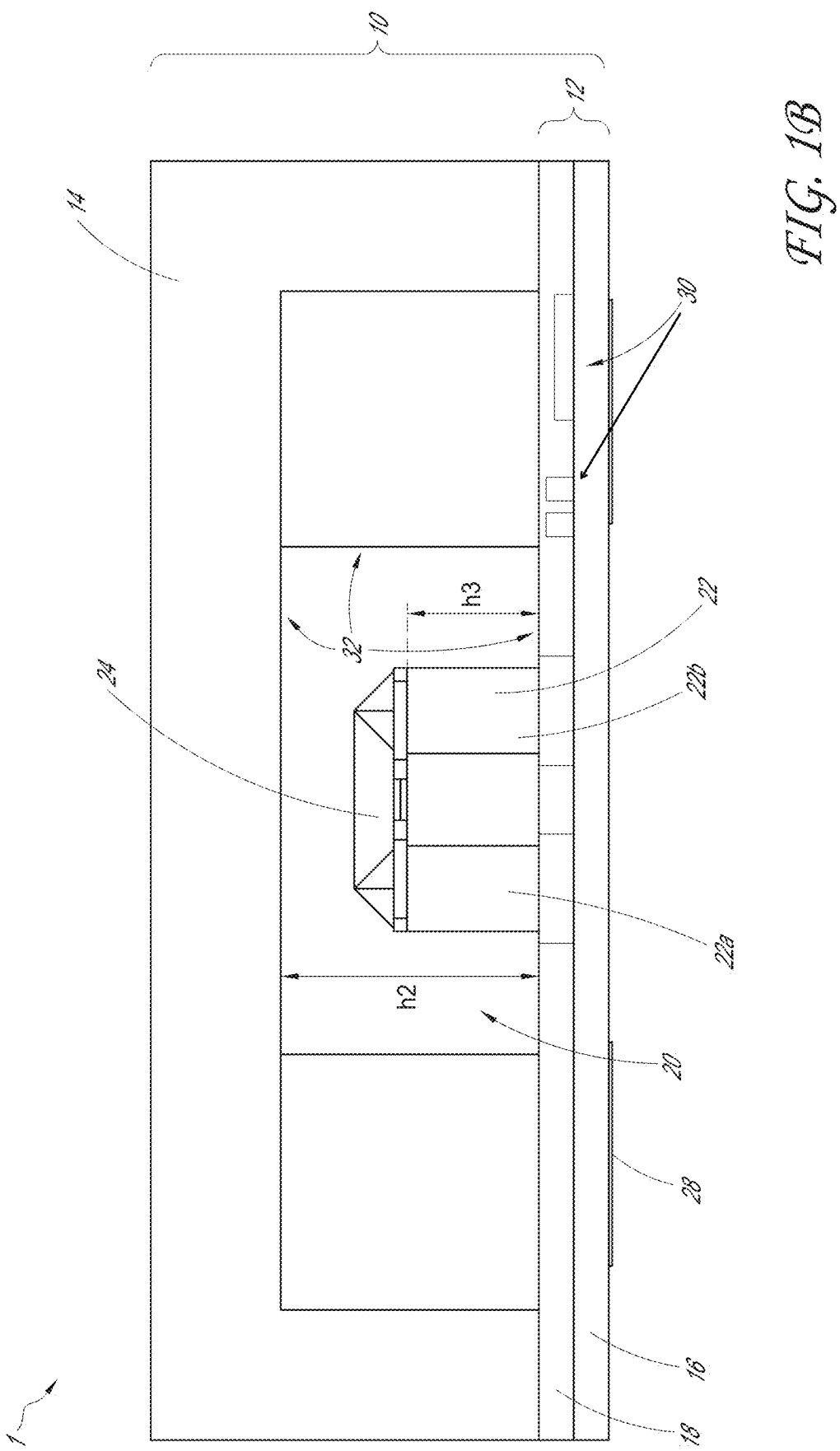

FIG. 1A is a schematic top perspective view of a sensor package 1 according to one embodiment. FIG. 1B is a schematic side view of the sensor package 1 illustrated in FIG. 1A. FIG. 1C is a schematic bottom perspective view of a sensor package 1 illustrated in FIGS. 1A and 1B. In some embodiment, the sensor package 1 can comprise a gas sensor, a fluid sensor, or a sample testing device for sensing properties of a fluid sample. The sensor package 1 can include a housing 10 that comprises a base 12 and a lid 14. The base 12 can comprise a substrate 16 and a cover layer 18 that covers at least a portion of the substrate 16. The housing 10 can at least partially define a channel 20 along which the fluid (e.g., liquid or gas) flows. In FIG. 1A, the lid 14 is illustrated as transparent, and in FIG. 1B, the cover layer 18 is illustrated transparent, to show internal components. The sensor package 1 can include a spacer 22 that is positioned on a portion of the base 12 and extending vertically into the channel 20, and a sensor die 24 on the spacer 22. In some embodiments, the sensor die 24 can comprise a bare die. The sensor die 24 can comprise a microelectromechanical systems (MEMs) or MEMs-like sensor with a nano-wire sensing element. In some embodiments, the nano-wire sensing element can comprise a piezoresistive silicon nano-wire. In some embodiments, only the sensor die 24 is mounted on the spacer 22.

In some applications, the housing 10 can comprise a bio-compatible housing. For example, the housing 10 can comprise a biocompatible material that does not interact with the drug or with the human body. In some embodiments, the biocompatible material can comprise a biocompatible polymer. In some other embodiments, the biocompatible material can comprise a biocompatible metal, or a metal with a biocompatible coating.

In some embodiments, the lid 14 can comprise any suitable material. In some embodiments, the lid 14 can comprise a non-conductive molding material. For example, the lid 14 can comprise a molding material, such as plastic or polymer (e.g., liquid crystal polymer (LCP) or acrylonitrile butadiene styrene (ABS)). The lid 14 can be formed or shaped (e.g., molded or otherwise formed) to define a cavity that cooperates with the substrate 12 to define the channel 20.

The substrate 16 can comprise any suitable package substrate, such as a flexible substrate including a nonconductive material and a plurality of embedded metal traces, a printed circuit board (PCB), a lead frame (e.g., a pre-molded lead frame) substrate, a ceramic substrate, etc. The substrate can have a plurality of contact pads 28 on a bottom side of the substrate 16. In some embodiments, the bottom side of the substrate 16 can define a bottom surface of the sensor package 1. The contact pads 28 can be electrically connected to an external device or substrate, or a larger system.

In some embodiments, electronic components 30 can be mounted to the substrate 16. The electronic components 30 can be embedded in the cover layer 18 as illustrated in FIG. 1B. In some embodiments, the electronic components 30 can be exposed to the channel 20 and in contact with a substance in the channel 20. In some embodiments, the electronic components 30 can electrically couple with the sensor die 24. For example, internal traces of the substrate 16 can convey electrical signals between the sensor die 24 and the electronic components 30. In some embodiments, the electronic components 30 can process data received from the sensor die 24. In some embodiments, the plurality of electronic components 30 can include an analog-to-digital convertor and/or passive components. In some embodiment, the electronic components 30 can comprise an application specific integrated circuit (ASIC) die that can receive signals transduced by the sensor die 24 and can pre-process the signals before transmission to a larger electronic system. In some embodiments, the electronic components 30 can comprise a sensor (e.g., a temperature sensor) that measures a temperature of the substance in the channel 20.

In some embodiments, the cover layer 18 can comprise a non-conductive molding material or molding compound, such as plastic or polymer (e.g., liquid crystal polymer (LCP) or acrylonitrile butadiene styrene (ABS)). In some embodiments, the cover layer 18 can protect the electronic components 30. In some embodiments, the cover layer 18 can act as an adhesive to adhere the lid 14 with the substrate 16.

The spacer 22 can comprise a conductive material. For example, the spacer 22 can comprise a metal slug. The metal slug can comprise a plurality (e.g., a pair) of metal legs 22a, 22b or poles that are electrically separated from each other. In some embodiments, one of the metal legs 22a, 22b can carry and provide an input signal to the sensor die 24 and another one of the metal legs 22a, 22b can carry an output signal from the sensor die 24. For example, a signal path can include a positive or negative voltage bias line and a reference (e.g., ground, common, etc.) line. In some embodiments, there can be more than two metal legs. In some embodiments the spacer 22 can provide a mechanical support for the sensor die 24, and electrical connection between the substrate 16 and the sensor die 24. Bottom ends of the legs can electrically connect to corresponding conductive pads of the substrate 16. For example, a conductive adhesive (e.g., solder) or a conductive epoxy can provide an electrical and mechanical connection between the legs and the conductive pads of the substrate 16. As shown in FIG. 1B, the spacer 22 can extend through the cover layer 18 to connect to the substrate 16. In such embodiments, the spacer 22 can include metal pads 22c, 22d. For example, when the base 12 is a laminate packaging substrate, the substrate 16 can comprise a laminate circuit board with electronic components 30 mounted thereon, and the cover layer 18 can be provided on the substrate 16 and protects the electronic components 30. Top surfaces of the metal pads 22c, 22d can be attached to the substrate 16 and exposed through the cover layer 18. The metal legs 22a, 22b can be connected to the top surfaces of the metal pads 22c, 22d respectively. When the base 12 is a bare PCB or flexible or pre-molded lead frame, the cover layer 18 can comprise, for example, a solder mask layer. In such embodiments, the metal pads 22c, 22d may be omitted and the metal legs 22a, 22b can be connected to the substrate 16 without the metal pad 22c, 22d. In some embodiments, the spacer 22 can extend transversely from the substrate 16 to connect to the sensor die 24.

The spacer 22 can vertically elevate the sensor die 24 from base 12 so as to position the sensor die 24 within the channel 20, e.g., within the flow pathway of the fluid to be monitored. In some embodiments, the spacer 22 can elevate the sensor die 24 so as to position the sensor die 24 away from inner surfaces 32 of the channel 20. For example, the spacer 22 can elevate the sensor die 24 so as to position the sensor die 24 at or near a center of a vertical cross section of the channel 20. When the sensor die 24 is mounted on the base 12 without the spacer 22 and adjacent one or more of the inner surfaces 32, a turbulence of a flowing substance at the sensor die 24 may be interrupted and an unwanted turbulence may be caused. The interrupted turbulence may slow down a flow speed of the fluid in the channel 22. When the sensor die 24 is positioned away from inner surfaces 32 of the channel 20 (e.g., at or near the center of the vertical cross section of the channel 20), the turbulent interruption may be reduced. Less turbulence interruption in the channel 20 can maintain the turbulence, which in turn can beneficially improve the functionality of the sensor die 24, in some applications. In some embodiments the sensor die 24 can hang off of the spacer 22 (see FIG. 2D).

In some embodiments, the sensor die 24 can comprise a gas sensor, a flow sensor, a temperature sensor, a bio-sensor, or any suitable sensors. In some embodiments, the sensor die 24 can comprise a bare sensor die. The sensor die 24 can generate current in response to being in contact with a target sample or substance (e.g., a gas or a liquid). By analyzing the generated current, various characteristics and/or properties, such as a bio-signature, a chemical signature, a chemical structure, a temperature, a pressure, and a flow speed, of the target sample can be detected.

The shapes of the channel 20, the spacer 22, and/or the sensor die 24 can affect the turbulence, flow speed, and/or pressure of the flowing substance in the channel 20. Therefore, the shapes of the channel 20, the spacer 22, and/or the sensor die 24 can be configured to control the turbulence, flow speed, and/or pressure of the flowing substance in the channel 20. In some embodiments, the channel 20 can have a horn shape as illustrated in FIG. 1A.

The sensor package 1 has a length l1, a width w1, and a height h1. In some embodiments, the length l1 of the sensor package 1 can be about 10 mm. For example, the length l1 of the sensor package 1 can in a range of 5 mm to 15 mm, in a range of 5 mm to 12 mm, in a range of 8 mm to 15 mm, or in a range of 8 mm to 12 mm. In some embodiments, the width w1 of the sensor package 1 can be about 10 mm. For example, the width w1 of the sensor package 1 can in a range of 5 mm to 15 mm, in a range of 5 mm to 12 mm, in a range of 8 mm to 15 mm, or in a range of 8 mm to 12 mm. In some embodiments, the height h1 of the sensor package 1 can be about 3.55 mm. For example, the height h1 of the sensor package 1 can in a range of 2 mm to 6 mm, in a range of 2 mm to 4 mm, in a range of 3 mm to 6 mm, or in a range of 3 mm to 4 mm.

The channel 20 of the sensor package 1 has a channel height h2, an upstream width w2, and a downstream width w3. In some embodiments, the upstream width w2 can be greater than the downstream width w3 of the channel 20. In some embodiments, the height h2 of the channel 20 can be about 2 mm. For example, the height h2 of the channel 20 can in a range of 1 mm to 3 mm, in a range of 1 mm to 2 mm, in a range of 2 mm to 3 mm, or in a range of 2 mm to 2.5 mm. In some embodiments, the upstream width w2 of the channel 20 can be about 8 mm. For example, the upstream width w2 of the channel 20 can in a range of 2 mm to 14 mm, in a range of 2 mm to 10 mm, in a range of 6 mm to 14 mm, or in a range of 6 mm to 10 mm. In some embodiments, the downstream width w3 of the channel 20 can be about 4 mm. For example, the downstream width w3 of the channel 20 can in a range of 2 mm to 14 mm, in a range of 2 mm to 10 mm, in a range of 3 mm to 10 mm, or in a range of 3 mm to 5 mm.

The sensor die 24 can be elevated by a height h3 from the base 12. In some embodiments, the sensor die 24 can be elevated by the height h3 of about 1 mm. For example, the height h3 can be in a range of 0.5 mm to 1.5 mm, in a range of 0.5 mm to 1.2 mm, in a range of 0.8 mm to 1.5 mm, or in a range of 0.8 mm to 1.2 mm. In some embodiments, the height h3 can be about 50% of the height h2 of the channel 20. For example, the height h3 can be in a range of 25% to 75% of the height h2 of the channel 20, in a range of 25% to 60% of the height h2 of the channel 20, in a range of 40% to 75% of the height h2 of the channel 20, or in a range of 40% to 60% of the height h2 of the channel 20.

Figure 2A:
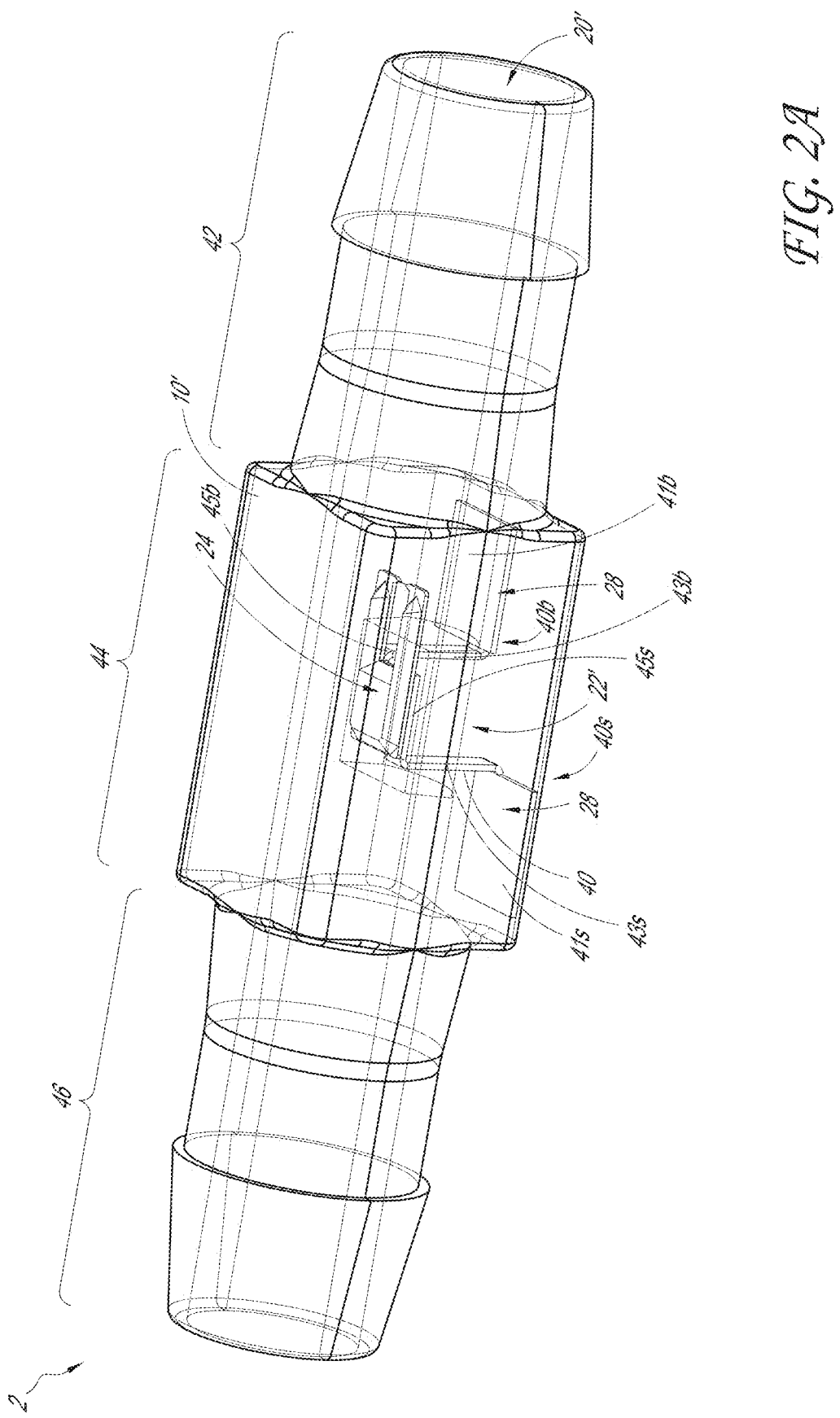
FIG. 2A is a schematic top perspective view of a sensor package according to one embodiment.
Figure 2B:
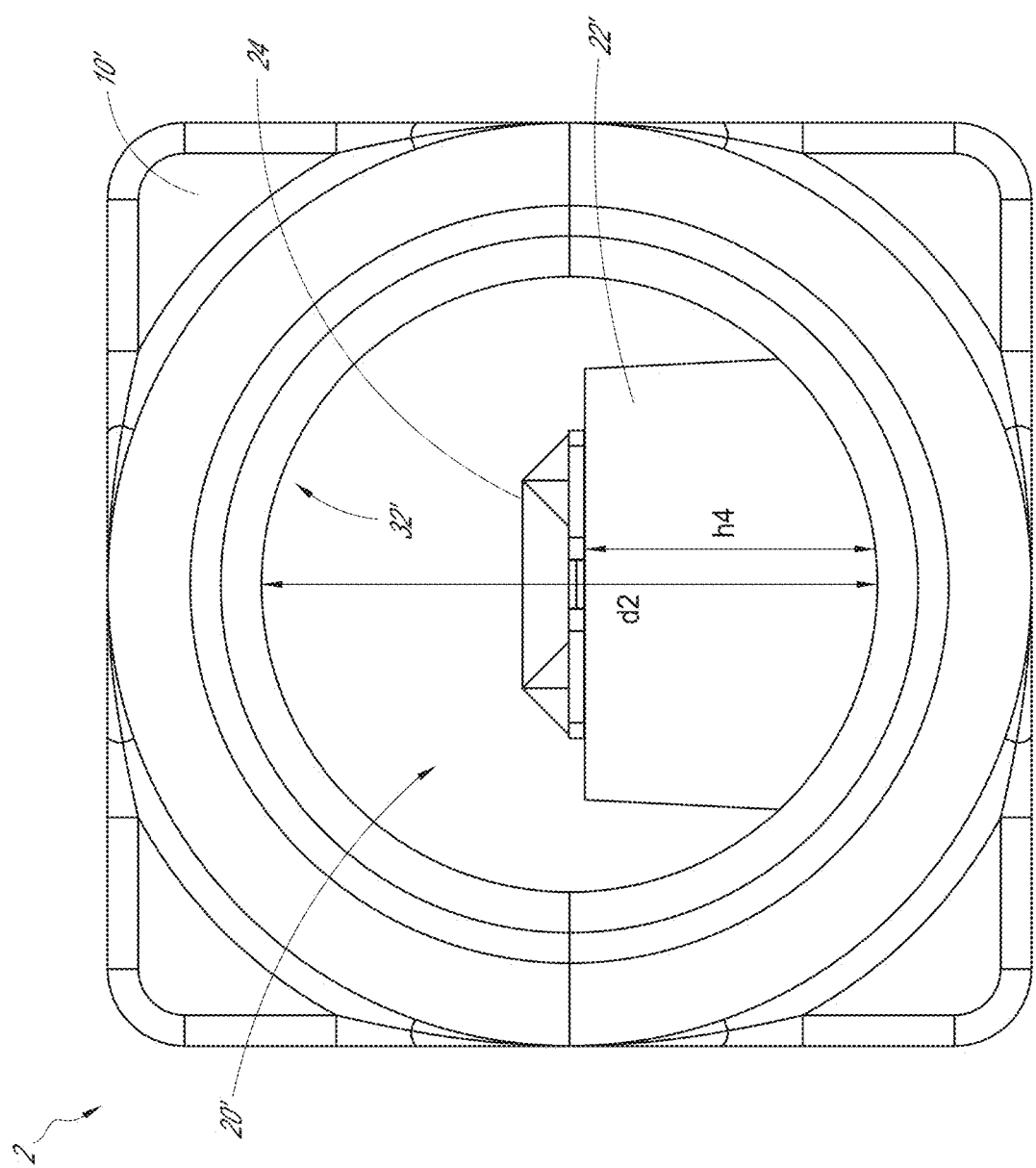
FIG. 2B is a schematic side view of the sensor package illustrated in FIG. 2A.
Figure 2C:
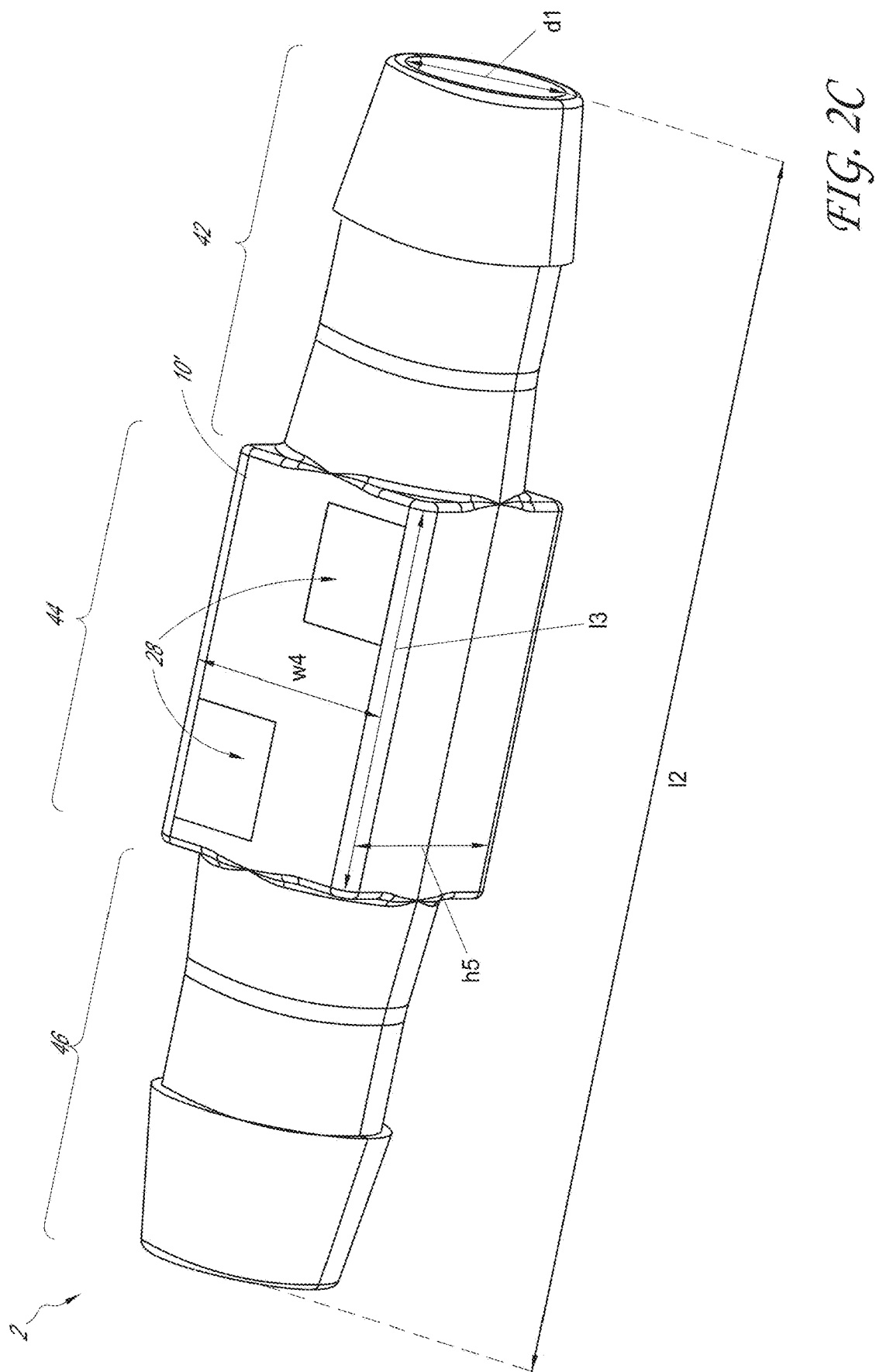
FIG. 2C is a schematic bottom perspective view of a sensor package illustrated in FIGS. 2A and 2B.

FIG. 2A is a schematic top perspective view of a sensor package 2 according to one embodiment. FIG. 2B is a schematic side view of the sensor package 2 illustrated in FIG. 2A. FIG. 2C is a schematic bottom perspective view of a sensor package 2 illustrated in FIGS. 2A and 2B. Unless otherwise noted, the components of FIGS. 2A-2C may be the same as or generally similar to like-numbered components of FIGS. 1A-1C. In some embodiment, the sensor package 2 can comprise a gas sensor, a fluid sensor, or a sample testing device for sensing properties of a sample. The sensor package 2 can include a housing 10' that at least partially defines a channel 20'. In FIG. 2A, the housing 10' is illustrated transparent. The sensor package 2 can include a standoff geometry (e.g., a spacer 22') that is positioned at a portion of an inner surface 32' of the channel 20', and a sensor die 24 on the spacer 22'.

The spacer 22' can comprise conductors 40 (e.g., a lead frame) that is embedded (e.g., molded) in a molding material. For example, the spacer 22' can comprise a molded metal lead frame, or a molded lead frame with conductive non-metal materials, such as conductive ABS, embedded in a non-conductive plastic mold. In some embodiments the housing 10' and the spacer 22' can be molded together as a single component. Such a sensor package that uses a molded lead frame can be manufactured using a relatively low cost manufacturing method, such as a molding process. Also, the molding process can be suitable for manufacturing relatively small electrochemical devices at much lower cost compared to other technologies for small electrochemical devices.

The conductors 40 can comprise a first conductor 40a and a second conductor 40b. Each of the first and second conductors 40a, 40b can respectively include a first laterally-extending segment 41a, 41b that is exposed on a bottom side of the package 2 and serves as a contact pad 28, a vertically-extending segment 43a, 43b that vertically spaces the sensor die 24 from the bottom side of the package 2, and a second laterally-extending segment 45a, 45b that electrically connects to the die 24. In some embodiments, the first laterally-extending segment 41a can extend distally from the vertical segment 43a, and the second laterally-extending segment 45a can extend proximally from the vertical segment 43a. In some embodiments, the first laterally-extending segment 41b can extend proximally from the vertical segment 43b, and the second laterally-extending segment 45b can extend proximally from the vertical segment 43b.

The sensor package 2 can comprise a proximal portion 42, a middle portion 44, and a distal portion 46. In some embodiments, the proximal portion 42 can be configured to connect to an intake tube that delivers a substance to be sensed by the sensor die 24. In some embodiments, the distal portion 46 can be configured to connect to an output or exhaust tube that delivers the substance that has been sensed by the sensor die 24.

The sensor die 24 can be elevated by a height h4 from the base 12. In some embodiments, the sensor die 24 can be elevated by the height h4 of about 1 mm. For example, the height h4 can be in a range of 0.5 mm to 1.5 mm, in a range of 0.5 mm to 1.2 mm, in a range of 0.8 mm to 1.5 mm, or in a range of 0.8 mm to 1.2 mm. In some embodiments, the height h4 can be about 50% of a diameter d2 of the channel 20'. For example, the height h4 can be in a range of 25% to 75% of the diameter d2 the channel 20', in a range of 25% to 60% of the diameter d2 of the channel 20', in a range of 40% to 75% of the diameter d2 of the channel 20', or in a range of 40% to 60% of the diameter d2 of the channel 20'.

The sensor package 2 has a length l2. In some embodiments, the length l2 of the sensor package 2 can be about 30 mm. For example, the length l2 of the sensor package 2 can be in a range from 15 mm to 45 mm, in a range of 15 mm to 40 mm, in a range of 20 mm to 45 mm, or in a range of 20 mm to 40 mm. The channel 20' has the diameter d2. Though the channel 20' is shown as a tubular channel, the channel 20' can have any suitable shape. In some embodiments, the diameter d2 of the channel 20' can be about 4 mm. For example the diameter d2 of the channel 20' can be in a range of 2 mm to 6 mm, in a range of 2 mm to 5 mm, in a range of 3 mm to 6 mm, or in a range of 3 mm to 5 mm. The middle portion of 44 the sensor package 2 has a length l3, a width w4, and a height h5. In some embodiments, the length l3 of the middle portion 44 can be about 10 mm. For example, the length l3 of the middle portion 44 can be in a range from 5 mm to 15 mm, in a range of 5 mm to 13 mm, in a range of 7 mm to 15 mm, or in a range of 7 mm to 13 mm. In some embodiments, the width w4 of the middle portion 44 can be about 2 mm. For example, the width w4 of the middle portion 44 can be in a range from 1 mm to 6 mm, in a range of 1 mm to 3 mm, in a range of 1.5 mm to 6 mm, or in a range of 1.5 mm to 3 mm. In some embodiments, the height h5 of the middle portion 44 can be about 6 mm. For example, the height h5 of the middle portion 44 can be in a range from 3 mm to 10 mm, in a range of 3 mm to 7 mm, in a range of 5 mm to 10 mm, or in a range of 5 mm to 7 mm.

FIG. 2D is a schematic top plan view of sensor package 2 without an upper half portion of the housing 10' to illustrate the internal components. As shown in FIG. 2D, the sensor die 24 is positioned on the spacer 22'. In some embodiments, at least a portion of the sensor die 24 can hang off of the spacer 22'. For example, at least a portion of the sensor die 24 can hang off of the spacer 22' in a proximal direction. The portion of the sensor die 24 that hangs off of the spacer 22' can comprise a sensing element 48. In some embodiments, the sensing element 48 can comprise a nanowire. In some embodiments, by hanging the sensing element 48 off of the spacer 22', a turbulence interruption of the flow of a substance in the channel 20' at or near the sensing element 48 can be reduced and the sensing element 48 of the sensor die can sense the target substance more effectively. In some embodiments, by hanging the sensing element 48 off of the spacer 22', a flow speed of the substance in the channel 20' at or near the sensing element 48 can be different from (e.g., faster than) when the sensing element 48 is on the spacer 22' and not hang off of the spacer 22', or when the sensor die is positioned in the chamber without the spacer 22'.

Figure 3A:
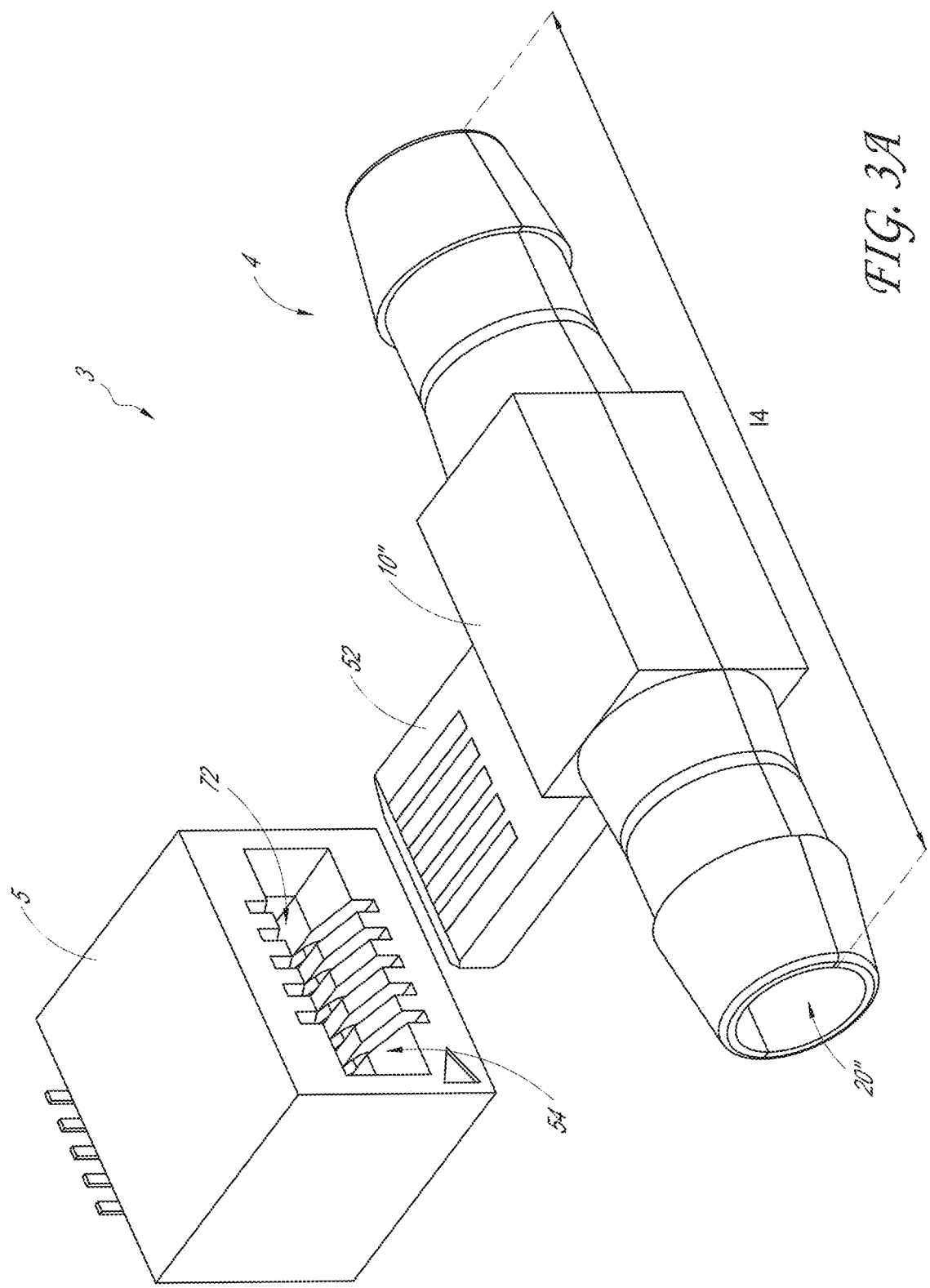
FIG. 3A is a schematic perspective view of a sensor assembly that includes a sensor package, according to one embodiment.
Figure 3B:
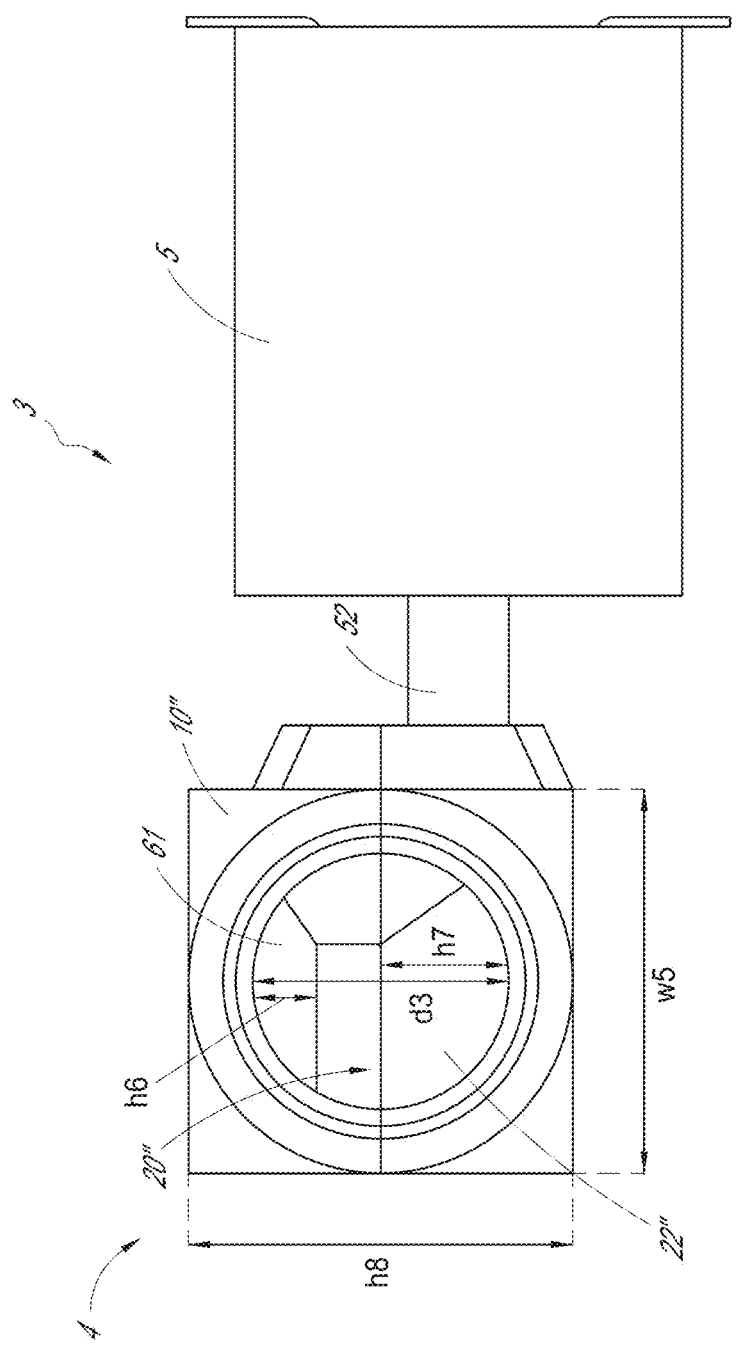
FIG. 3B is a schematic side view of the sensor assembly illustrated in FIG. 3A.
Figure 3C:
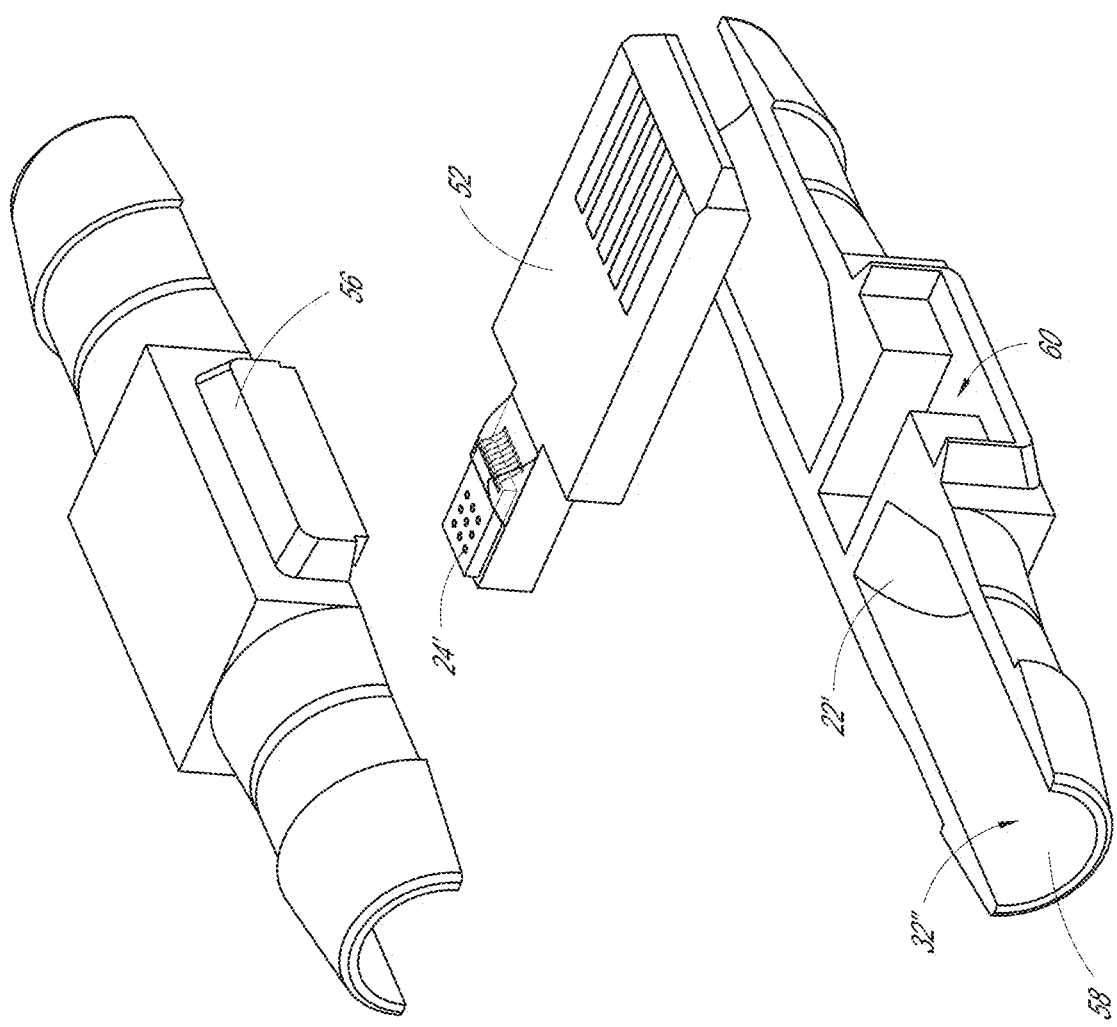
FIG. 3C is a schematic exploded view of the sensor package in FIGS. 3A and 3B.
Figure 3D:
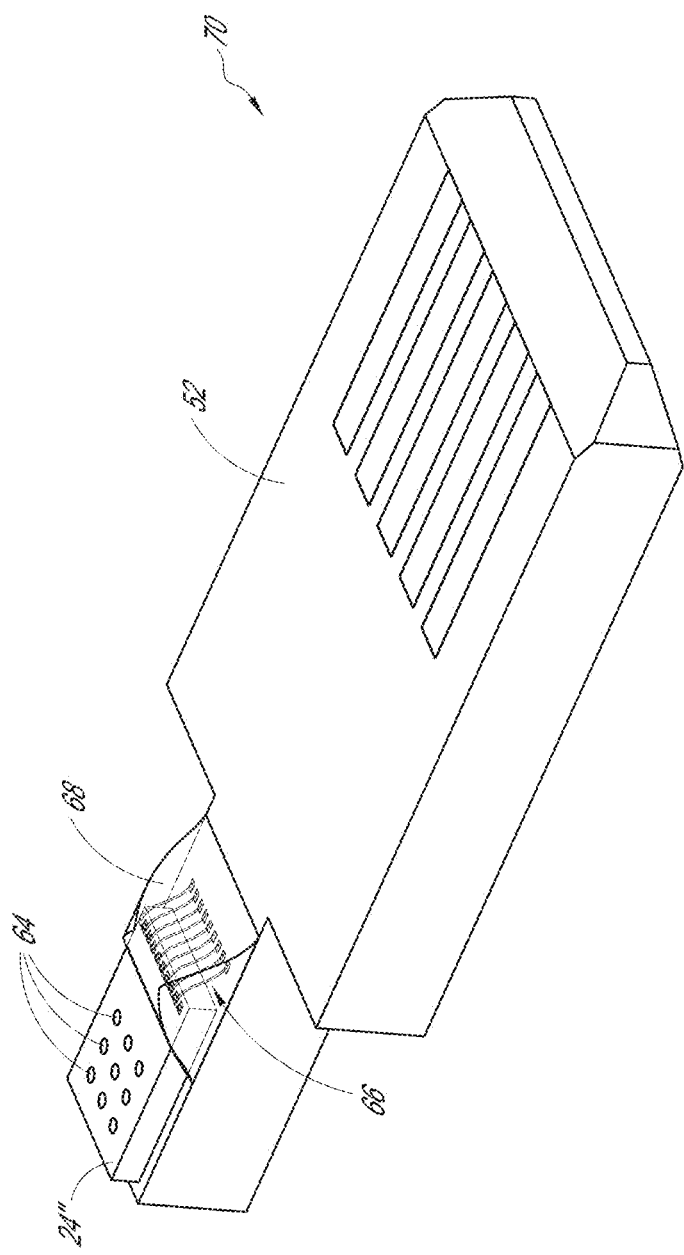
FIG. 3D is a schematic perspective view of a sensor die mounted on a substrate.

FIG. 3A is a schematic perspective view of a sensor assembly 3 that includes a sensor package 4, according to one embodiment. FIG. 3B is a schematic side view of the sensor assembly 3. FIG. 3C is a schematic exploded view of the sensor package 4. FIG. 3D is a schematic perspective view of a sensor die 24' mounted on a substrate 52. Unless otherwise noted, the components of FIGS. 3A-3D may be the same as or generally similar to like-numbered components of FIGS. 1A-2D. The sensor assembly 3 can comprise the sensor package 4 and a connector 5. A connector portion of the substrate 52 can be inserted to a connection receiver 54 to couple the sensor package 4 with the connector 5. The connector 5 can be configured to couple the sensor package 4 to a larger system, device, or a substrate (e.g., a printed circuit board (PCB)). In some embodiment, the sensor package 4 can comprise a gas sensor, a fluid sensor, or a sample testing device for sensing properties of a sample. The sensor package 4 can include a housing 10" that at least partially define a channel 20". The sensor package 4 can include a spacer 22" that is positioned in the channel 20", and a sensor die 24' mounted to a die mount portion of the substrate 52 and exposed to the channel 20". In some embodiments, the spacer 22" can be separately formed from the housing 10" and positioned at a portion of an inner surface 32" of the channel 20". In some other embodiments, the spacer 22" can be formed as a portion of the housing 10".

In some embodiments, the housing 10" can comprise an upper portion 56 and a lower portion 58 that are separately formed and coupled together. However, in some embodiments, the upper portion 56 and the lower portion 58 can be integrally formed in a single process. The lower portion 58 can comprise a slot 60 that is configured to receive at least a portion of the substrate 52. The slot 60 can be recessed below the channel 20". In some embodiments, the slot 60 can be formed with in the spacer 22". In some embodiments, an adhesive (not shown) can be disposed between the slot 60 and the portion of the substrate 52 to mechanically couple the lower portion 58 of the housing 10" and the substrate 52. In some embodiments, the housing 10" can comprise a narrowing feature that narrows a region of the channel 20" relative to another portion of the channel 20". The upper portion 56 can comprise a protrusion 61, and the lower portion 58 can comprise the spacer 22". The narrowing features can comprise the protrusion 61 and the spacer 22".

In some embodiments, the protrusion 61 can comprise a tapered, curved, or sloped surface. The protrusion 61 can narrow a portion of the channel 20". In some embodiments, the channel 20" at or near the protrusion 61 can be narrower than a portion of the channel 20" upstream of the protrusion 61. In some embodiments, the channel 20" can have wide regions and a narrow region that is narrower than the wide regions positioned between the wide regions. The protrusion 61 can change a flow speed of the substance flowing in the channel 20" and/or a pressure in the channel 20" in the narrow region relative to the wide regions.

In some embodiments, the spacer 22" can comprise a tapered, curved, or sloped surface. The spacer 22" can narrow a portion of the channel 20". In some embodiments, the channel 20" at or near the spacer 22" can be narrower than a portion of the channel 20" upstream of the spacer 22". In some embodiments, the channel 20" can have wide regions and a narrow region that is narrower than the wide regions positioned between the wide regions. The spacer 22" can change a flow speed of the substance flowing in the channel 20" and/or a pressure in the channel 20" in the narrow region relative to the wide regions. Both the protrusion 61 and the spacer 22" can be in the narrow region.

The sensor die 24' can be positioned on the substrate 52 and exposed to the channel 20". The sensor die 24' can be positioned in the narrow region of the channel 20" within the slot 60. The sensor die 24' can comprise sensing elements 64. In some embodiments, the sensing elements 64 can be recessed below an uppermost portion of the spacer 22", flush with the uppermost portion of the spacer 22", or protrude above the upper most portion of the spacer 22". The sensor die 24' can generate current in response to being in contact with a target sample or substance (e.g., a gas or a liquid). By analyzing the generated current, various characteristics and/or properties, such as a bio-signature, a chemical signature, a chemical structure, a temperature, a pressure, and a flow speed, of the target sample can be detected. The analysis of the generated current can be conducted by a system to which that the connector 5 ultimately communicates with.

In some embodiments, the sensor die 24' can be electrically connected with the substrate 52 by way of bonding wires 66. The bonding wires 66 can be encapsulated with epoxy 68. However, in some other embodiments, the sensor die 24' can be flip-chip mounted to the substrate 52. In such embodiments, through substrate vias (TSVs) can convey signals from the sensing elements 64 to contact pads on the opposing surface of the die 24'. The substrate 52 can comprise electrical interconnects (not shown) that brings signals received from the sensor die 24' to connection pins 70. The connection pins 70 can be electrically connected to corresponding receiver pins 72 of the connector 5. The substrate 52 can be removably coupled with the connector 5. The connector 5 can be part of a larger system, device, or a substrate (e.g., a printed circuit board (PCB)).

The channel 20" has a diameter d3. Though the channel 20" is shown as a tubular channel, the channel 20" can have any suitable shape. In some embodiments, the diameter d3 of the channel 20" can be about 4 mm. For example the diameter d3 of the channel 20" can be in a range of 2 mm to 6 mm, in a range of 2 mm to 5 mm, in a range of 3 mm to 6 mm, or in a range of 3 mm to 5 mm.

The protrusion 61 has a height h6. In some embodiments, the height h6 of the protrusion 61 can be about 0.5 mm. For example, the height h6 of the protrusion 61 can be in a range of 0.25 mm to 1 mm, in a range of 0.25 mm to 0.75 mm, in a range of 0.4 mm to 1 mm, or in a range of 0.4 mm to 0.75 mm. In some embodiments, the height h6 can be about 50% of a diameter d3 of the channel 20". For example, the height h6 can be in a range of 25% to 75% of the diameter d3 the channel 20", in a range of 25% to 60% of the diameter d3 of the channel 20", in a range of 40% to 75% of the diameter d3 of the channel 20", or in a range of 40% to 60% of the diameter d3 of the channel 20".

The spacer 22" has a height h7. In some embodiments, the height h7 of the spacer 22" can be about 2 mm. For example, the height h7 of the spacer 22" can be in a range of 1 mm to 3 mm, in a range of 1 mm to 2.5 mm, in a range of 1.5 mm to 3 mm, or in a range of 1.5 mm to 2.5 mm. In some embodiments, the height h7 of the spacer 22" can be about 50% of a diameter d3 of the channel 20". For example, the height h7 of the spacer 22" can be in a range of 25% to 75% of the diameter d3 the channel 20", in a range of 25% to 60% of the diameter d3 of the channel 20", in a range of 40% to 75% of the diameter d3 of the channel 20", or in a range of 40% to 60% of the diameter d3 of the channel 20".

In some embodiments, a cross sectional size of the narrow region of the channel can be about 25% of a cross sectional size of the wide region. For example, a cross sectional size of the narrow region of the channel can be in a range of 20% to 50%, in a range of 20% to 40%, in a range of 25% to 40%, of a cross sectional size of the wide region.

The sensor package 4 has a length l4, a width w5, and a height h8. In some embodiments, the length l4 of the sensor package 4 can be about 30 mm. For example, the length l4 of the sensor package 4 can be in a range from 15 mm to 45 mm, in a range of 15 mm to 40 mm, in a range of 20 mm to 45 mm, or in a range of 20 mm to 40 mm. In some embodiments, the width w5 of the sensor package 4 can be about 6 mm. For example, the width w4 of the sensor package 4 can be in a range from 4 mm to 8 mm, in a range of 4 mm to 7 mm, in a range of 5 mm to 8 mm, or in a range of 5 mm to 7 mm. In some embodiments, the height h8 of the sensor package 4 can be about 6 mm. For example, the height h8 of the sensor package 4 can be in a range from 4 mm to 8 mm, in a range of 4 mm to 7 mm, in a range of 5 mm to 8 mm, or in a range of 5 mm to 7 mm.

Although disclosed in the context of certain embodiments and examples, it will be understood by those skilled in the art that the present invention extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A sensor package comprising:
   a housing at least partially defining a flow channel;
   an electrically conductive spacer disposed on a surface of the housing and in the flow channel; and
   a sensor die disposed in and exposed to the flow channel and electrically attached to the spacer such that the sensor die is elevated relative to the surface of the housing.

2. The sensor package of claim 1, wherein the housing comprises a substrate and a lid, and the sensor die is electrically coupled with the substrate through the spacer.

3. The sensor package of claim 2, wherein the housing further comprises a mold compound disposed at least partially between the substrate and the lid, and wherein an electrical component is embedded in the mold compound.

4. The sensor package of claim 2, wherein the substrate includes contact pads configured to electrically connect the sensor package with an external device or system.

5. The sensor package of claim 1, wherein the spacer comprises a metal slug extending transversely from the substrate to connect to the sensor die.

6. The sensor package of claim 1, wherein the spacer comprises an embedded lead frame having a conductor at least partially embedded in the spacer.

7. The sensor package of claim 1, wherein the flow channel comprises a first portion and a second portion spaced apart from the first portion along a length of the flow channel, the first portion having a channel size different from a channel size of the second portion.

8. The sensor package of claim 1, wherein the sensor die comprises a gas sensor die or a biological sensor.

9. The sensor package of claim 1, wherein the sensor die comprises a microelectromechanical systems (MEMs)-like sensor with a nano-wire sensing element.

10. The sensor package of claim 1, wherein the sensor die comprises a sensing element that hangs off of the spacer.

11. The sensor package of claim 1, wherein the sensor die is elevated relative to the surface of the housing such that the sensor die is positioned in a middle of a cross section of the flow channel.

12. The sensor package of claim 1, wherein the sensor die and the spacer are configured to fit in the flow channel having a cross sectional height in a range of 1 mm to 3 mm.

13. A sensor package comprising:
a housing at least partially defining a flow channel;
a spacer disposed on a surface of the housing and in the flow channel, the spacer comprising an embedded lead frame having a conductor at least partially embedded in a nonconductive portion of the spacer; and
a sensing element disposed in the flow channel, the sensing element electrically and mechanically attached to the spacer such that the sensing element is elevated relative to the surface of the housing.

14. The sensor package of claim 13, wherein the sensing element comprises a nano-wire sensing element.

15. The sensor package of claim 13, wherein the sensing element hangs off of the spacer.

16. The sensor package of claim 13, wherein the sensing element is elevated relative to the surface of the housing by a height in a range of 0.5 mm to 1.5 mm.

17. A sensor package comprising:
a housing at least partially defining a flow channel and a slot recessed below the flow channel, the flow channel having a narrow region and a wide region that is wider than the narrow region;
a substrate having a die mount portion and a connector portion, the die mount portion disposed in the slot;
a sensing element disposed on the die mount region of the substrate and exposed to the flow channel, the sensing element electrically coupled with the substrate, the sensing element is positioned such that the sensing element is exposed to the narrow region.

18. The sensor package of claim 17, further comprising a spacer disposed in the narrow region of the channel, the spacer having a tapered surface.

19. The sensor package of claim 17, wherein the connector portion of the substrate configured to connect to an external connector, the substrate configured to electrically connect the sensing element with the connector.

20. The sensor package of claim 17, wherein a cross sectional size of the narrow region is 20% to 50% of a cross sectional size of the wide region.

* * * * *